(12) United States Patent
Chang et al.

(10) Patent No.: US 11,342,213 B2
(45) Date of Patent: May 24, 2022

(54) APPARATUS AND METHOD OF MICRO-DEVICES TRANSFER

(71) Applicant: Nano Ark Co., San Jose, CA (US)

(72) Inventors: Paichun Chang, San Jose, CA (US); Sheng-Ru Lee, San Jose, CA (US)

(73) Assignee: NANO ARK CO., San Jose, CA (US)

( * ) Notice: Subject to any disclaimer, the term of this patent is extended or adjusted under 35 U.S.C. 154(b) by 0 days.

(21) Appl. No.: 16/994,710

(22) Filed: Aug. 17, 2020

(65) Prior Publication Data

US 2021/0082734 A1 Mar. 18, 2021

Related U.S. Application Data

(60) Provisional application No. 62/890,794, filed on Aug. 23, 2019.

(51) Int. Cl.
| | |
|---|---|
| *H01L 21/683* | (2006.01) |
| *H01L 25/075* | (2006.01) |
| *H01L 33/62* | (2010.01) |

(52) U.S. Cl.
CPC ...... *H01L 21/6835* (2013.01); *H01L 25/0753* (2013.01); *H01L 33/62* (2013.01); *H01L 2221/68354* (2013.01); *H01L 2221/68363* (2013.01); *H01L 2933/0066* (2013.01)

(58) Field of Classification Search
CPC ............. H01L 21/6835; H01L 25/0753; H01L 33/62; H01L 2221/68363; H01L 2933/0066; H01L 2221/68354; H01L 2221/68313; H01L 2221/68322; H01L 2221/68381; H01L 33/0095
USPC .......................................................... 428/28
See application file for complete search history.

(56) References Cited

U.S. PATENT DOCUMENTS

| | | | |
|---|---|---|---|
| 10,224,231 B2 * | 3/2019 | Bower ................ | H01L 33/0093 |
| 2015/0236230 A1 * | 8/2015 | Miyata .................... | H01L 33/62 |
| | | | 257/98 |
| 2019/0287927 A1 * | 9/2019 | Iyer ........................ | H01L 24/32 |

* cited by examiner

*Primary Examiner* — Vu A Vu
(74) *Attorney, Agent, or Firm* — Bacon & Thomas, PLLC

(57) ABSTRACT

A method of micro-devices transfer comprising following steps of: providing a flexible carrier including a plurality of grooves which are designed in positions corresponding one-to-one to a plurality of target surface portions of an outer surface of a target member, each of the grooves has an opening in a first surface of the flexible carrier; applying at least one external force to the flexible carrier such that the opening of each of the grooves is enlarged; placing a plurality of micro-devices in the grooves respectively; releasing the at least one external force such that the micro-devices are held by the grooves of the flexible carrier and auto-aligned in positions corresponding one-to-one to the target surface portions of the outer surface of the target member; aligning and bonding the micro-devices to the target surface portions of the outer surface of the target member; and removing the flexible carrier.

27 Claims, 8 Drawing Sheets

APPARATUS AND METHOD OF MICRO-DEVICES TRANSFER

FIELD OF THE INVENTION

The present invention is related to an apparatus and a method of micro-devices transfer, especially an apparatus and a method of auto-aligned micro-devices transfer.

BACKGROUND OF THE INVENTION

Please refer to FIGS. 4A-4D, which are the cross-sectional schematics showing the process steps of a method of micro-devices transfer of conventional technology. The method of micro-devices transfer of conventional technology comprises following steps of: (please referring to FIG. 4C) providing a plurality of target devices 97, wherein the target devices 97 are formed on a target substrate 96; (please referring to FIG. 4A) providing a plurality of micro-devices 93, wherein the micro-devices 93 are placed in a plurality of grooves of a host carrier 92 respectively, wherein each of the grooves is defined by a surrounding 94 and a bottom 95; providing a transfer carrier 90, wherein the transfer carrier 90 comprises a plurality of mesas 91, wherein the mesas 91 of the transfer carrier 90 are in positions corresponding one-to-one to the grooves of the host carrier 92, and wherein the target devices 97 of the target substrate 96 are in positions corresponding one-to-one to the mesas 91 of the transfer carrier 90; charging the micro-devices 93 and discharging the mesas 91 such that the charges of micro-devices 93 (negative) are opposite to the charges of the mesas 91 (positive); aligning the mesas 91 to the micro-devices 93; (please referring to FIG. 4B) moving the mesas 91 close to the micro-devices 93 such that the micro-devices 93 are transferred to the mesas 91 of the transfer carrier 90; (please referring to FIG. 4C) aligning the micro-devices 93 to the target devices 97 of the target substrate 96; (please referring to FIG. 4D) bonding the micro-devices 93 to the target devices 97 of the target substrate 96 and removing the transfer carrier 90. However, the cost of the equipment of convention technology is too high. When the pitches of the target devices 97 of the target substrate 96 are changed, the mesas 91 of the transfer carrier 90 and the grooves of the host carrier 92 must be remade to fit the pitches of the target devices 97 of the target substrate 96. Moreover, the micro-devices 93 are placed into the grooves of the host carrier 92; therefore, each of the grooves of the host carrier 92 is a little bit larger than the corresponding one of the micro-devices 93. That is that the positions of the micro-devices 93 in the grooves of the host carrier 92 may have some tolerance. Furthermore, when the micro-devices 93 are transferred to the mesas 91 of the transfer carrier 90, the micro-devices 93 may laterally shift slightly, respectively. This may result some more tolerance. Hence, the accuracy of the method of micro-devices transfer of conventional technology is poor.

Moreover, the host carrier 92 has a flat top surface; the target substrate 96 has a flat top surface; and each of the target devices 97 of the target substrate 96 also has a flat top surface. The method of micro-devices transfer of conventional technology may transfer the micro-devices 93 from the host carrier 92 (having the flat top surface) to the target substrate 96 (having the flat top surface). However, conventional technology cannot transfer the micro-devices 93 from the host carrier 92 (having the flat top surface) to the target substrate 96 which has a curved top surface. Conventional technology can neither transfer to micro-devices 93 from the host carrier 92 (having the flat top surface) to the target devices 97 of the target substrate 96, wherein each of the target devices 97 has a curved top surface.

Accordingly, the present invention has developed a new design which may avoid the above-described drawbacks, may significantly enhance the performance of the devices and may take into account economic considerations. Therefore, the present invention then has been invented.

SUMMARY OF THE INVENTION

The main technical problems that the present invention is seeking to solve are to increase the accuracy of the micro-devices transfer, to achieve to transfer the micro-devices to a curved surface or curved surfaces, and to reduce the cost of the equipment.

In order to solve the above described problems and to achieve the expected effect, the present invention provides a first embodiment of a method of micro-devices transfer. The method comprises following steps of: providing a target member, wherein the target member has an outer surface, the outer surface of the target member includes a plurality of target surface portions; providing a plurality of micro-devices, wherein the micro-devices are arranged located on a host carrier in positions corresponding one-to-one to the target surface portions of the outer surface of the target member; coating a resin on an outer surface of each of the micro-devices and an exposed top surface of the host carrier; curing the resin to form a flexible carrier; removing the host carrier; aligning and bonding the micro-devices to the target surface portions of the outer surface of the target member; and removing the flexible carrier. The first embodiment of the method of micro-devices transfer can significantly raise the accuracy and the cost of the equipment can be significantly reduced.

Moreover, the present invention further provides a second embodiment of a method of micro-devices transfer. The method comprises following steps of: providing a plurality of micro-devices; providing a target member, wherein the target member has an outer surface, the outer surface of the target member includes a plurality of target surface portions; providing a flexible carrier, wherein the flexible carrier comprises a plurality of grooves, the grooves of the flexible carrier are designed in positions corresponding one-to-one to the target surface portions of the outer surface of the target member, wherein each of the grooves has an opening in a first surface of the flexible carrier; applying at least one external force to the flexible carrier such that the opening of each of the grooves is enlarged; placing the micro-devices in the grooves respectively; releasing the at least one external force such that the micro-devices are held by the grooves of the flexible carrier and the micro-devices are auto-aligned in positions corresponding one-to-one to the target surface portions of the outer surface of the target member; aligning and bonding the micro-devices to the target surface portions of the outer surface of the target member; and removing the flexible carrier. The second embodiment of the method of micro-devices transfer can significantly raise the accuracy and the cost of the equipment can be significantly reduced.

In an embodiment, after releasing the at least one external force and before aligning and bonding the micro-devices to the target surface portions of the outer surface of the target member, the method further comprises a following step of: placing the flexible carrier upside down.

In an embodiment, before applying at least one external force to the flexible carrier, the micro-devices are provided and arranged located on a host carrier; wherein when applying at least one external force to the flexible carrier, the opening of each of the grooves is enlarged and the grooves of the flexible carrier are in positions corresponding one-to-one to the micro-devices arranged located on the host carrier; wherein after releasing the at least one external force, the micro-devices are held by the grooves of the flexible carrier and the micro-devices are auto-aligned in positions corresponding one-to-one to the target surface portions of the outer surface of the target member.

Moreover, the present invention further provides an apparatus of micro-devices transfer, which comprises a flexible carrier, wherein the flexible carrier is provided for transferring a plurality of micro-devices to a target member, wherein the flexible carrier comprises a plurality of grooves, each of the grooves has an opening in a first surface of the flexible carrier, the target member has an outer surface, the outer surface of the target member includes a plurality of target surface portions, the grooves of the flexible carrier are designed in positions corresponding one-to-one to the target surface portions of the outer surface of the target member; when at least one external force is applied to the flexible carrier, the opening of each of the grooves is enlarged, the micro-devices are capable of being placed in the grooves respectively; after the at least one external force is released, the micro-devices are held by the grooves of the flexible carrier and the micro-devices are auto-aligned in positions corresponding one-to-one to the target surface portions of the outer surface of the target member, so that the micro-devices are capable of being aligned and bonded to the target surface portions of the outer surface of the target member.

In an embodiment, the outer surface of the target member is a curved surface. The present invention can transfer the micro-devices to the curved outer surface of the target member; especially when the micro-devices are flexible, the present invention can make the flexible micro-devices to fit along the curved outer surface of the target member. In another embodiment, each of the target surface portions of the outer surface of the target member is a curved surface. In an embodiment, the outer surface of the target member is a curved surface and each of the target surface portions of the outer surface of the target member is a curved surface. The first embodiment and the second embodiment of the method of micro-devices transfer of the present invention can indeed achieve to transfer the micro-devices to the curved surface or the curved target surface portions.

In an embodiment, the opening of each of the grooves is designed no larger than a cross-section of a corresponding one of the micro-devices. In another embodiment, a contour of the opening of each of the grooves is designed the same as a contour of a cross-section of a corresponding one of the micro-devices. In an embodiment, a depth of each of the grooves is designed no greater than a thickness of a corresponding one of the micro-devices. In another embodiment, each of the micro-devices is protruding outwardly from the first surface of the flexible carrier.

In an embodiment, the target member further comprises a bonding layer, the bonding layer includes a plurality of bonding layer portions formed on the target surface portions of the outer surface of the target member respectively, the micro-devices are bonded to the bonding layer portions of the bonding layer formed on the target surface portions of the outer surface of the target member, wherein the bonding layer is made of at least one material selected from the group consisting of: bismuth, bismuth alloy, gallium, gallium alloy, tin, tin alloy, gold, gold alloy, indium, indium alloy, zinc, zinc alloy, cadmium, cadmium alloy, tellurium, tellurium alloy, antimony, antimony alloy, epoxy adhesive, silicon adhesive, PU adhesive, acrylic adhesive and fluorine adhesive. In an embodiment, the flexible carrier having a transparency sufficient to transmit at least about 10 percent in the spectrum range of (1) visible light, (2) near infrared light, or (3) visible light and near infrared light. In an embodiment, the resin (flexible carrier) is made of at least one material selected from the group consisting of: epoxy, silicone, robber, polymer, and plastics. In an embodiment, the resin (flexible carrier) further comprises additives, the additives is at least one material selected from the group consisting of: metal particles, semiconductor particles, and ceramic particles. In an embodiment, the micro-devices are bonded to the target surface portions of the outer surface of the target member by (1) Van der Waals force, (2) chemical bond, (3) magnetic force, (4) electric force, (5) melting a portion of the micro-devices, (6) melting a portion of the target surface portions of the outer surface of the target member, or (7) melting a portion of the micro-devices and a portion of the target surface portions of the outer surface of the target member.

For further understanding the characteristics and effects of the present invention, some preferred embodiments referred to drawings are in detail described as follows.

DETAILED DESCRIPTIONS OF PREFERRED EMBODIMENTS

Figure 1A:
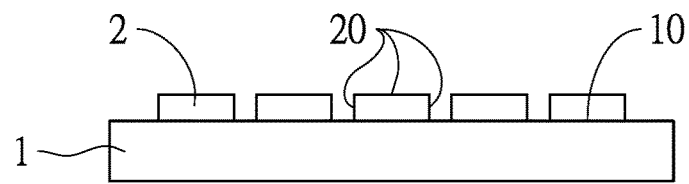
FIGS. 1A-1E are the cross-sectional schematics showing the process steps of the first embodiment of a method of micro-devices transfer of the present invention.
Figure 1B:
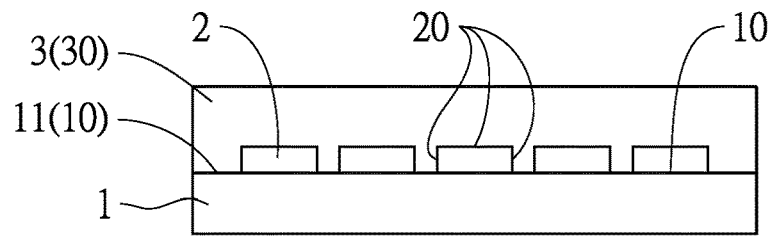
Figure 1C:
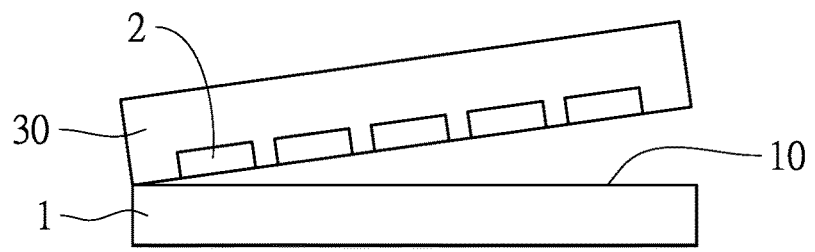
Figure 1D:
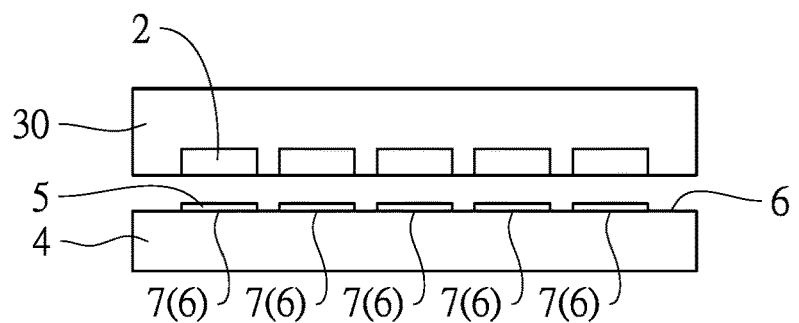
Figure 1E:
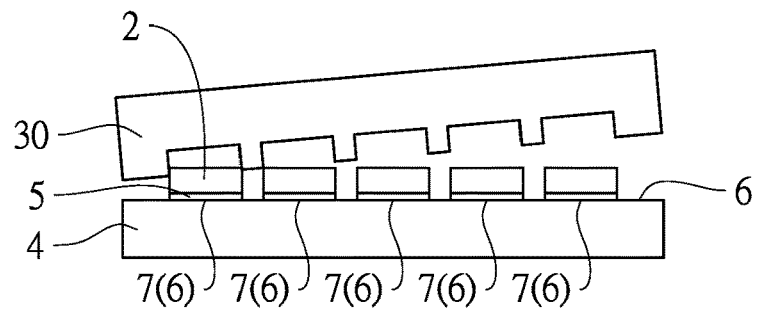

Please refer to FIGS. 1A-1E, which are the cross-sectional schematics showing the process steps of the first embodiment of a method of micro-devices transfer of the present invention. The present invention provides the first embodiment of the method of micro-devices transfer. The method comprises following steps of: Step A~Step G. The Step A (please referring to FIG. 1D): providing a target member 4. The target member 4 has an outer surface 6, wherein the outer surface 6 of the target member 4 includes a plurality of target surface portions 7. The target member 4 comprises a bonding layer 5, wherein the bonding layer 5 includes a plurality of bonding layer portions formed on the target surface portions 7 of the outer surface 6 of the target member 4 respectively. The bonding layer 5 is made of gold tin solder (AuSn alloy) with Au weight percentage equal to 80 and Sn weight percentage equal to 20. The target member 4 is a substrate. The target surface portions 7 of the outer surface 6 are the outer surface of the leads, wherein the leads are formed on the target member 4. The Step B (please referring to FIG. 1A): providing a plurality of micro-devices 2, wherein the micro-devices 2 are arranged located on a top surface 10 of a host carrier 1 in positions corresponding one-to-one to the bonding layer portions of the bonding layer 5 formed on the target surface portions 7 of the outer surface 6 of the target member 4 (the micro-devices 2 are also in positions corresponding one-to-one to the target surface portions 7 of the outer surface 6 of the target member 4). The host carrier 1 is a tape. The micro-devices 2 are adhered on the top surface 10 of the host carrier 1. The micro-devices 2 are light emitting diodes (LEDs). The Step C (please referring to FIG. 1B): coating a resin 3 on an outer surface 20 of each of the micro-devices 2 and an exposed portion 11 of the top surface 10 of the host carrier 1. The resin 3 is made of silicone. The Step D: curing the resin 3 to form a flexible carrier 30. The Step E (please referring to FIG. 1C): removing the host carrier 1. The Step F (please referring to FIG. 1D): aligning and bonding the micro-devices 2 to the corresponding bonding layer portions of the bonding layer 5 formed on the target surface portions 7 of the outer surface 6 of the target member 4 respectively. The melting temperature of the bonding layer 5 (gold tin) is about 280 degrees in C. Hence, the material of the flexible carrier 30 must have a heat-resistant temperature at least higher than the melting temperature of the bonding layer 5. When heat up to 280 degrees in C, the bonding layer 5 (gold tin) is melted. Then after cooling down, the micro-devices 2 and the corresponding target surface portions 7 of the outer surface 6 of the target member 4 are bonded by the corresponding bonding layer portions of the bonding layer 5 (gold tin). The Step G (please referring to FIG. 1E): removing the flexible carrier 30. The first embodiment of the method of micro-devices transfer can indeed achieve significantly high accuracy micro-devices transfer from a flat surface (top surface 10 of the host carrier 1) to a flat surface (the target surface portions 7 of the outer surface 6 of the target member 4). And the cost of the equipment is significantly reduced.

In some embodiments, in the Step E, the host carrier 1 is removed by etching or dissolving.

In some embodiments, the resin 3 (flexible carrier 30) may be made of at least one material selected from the group consisting of: epoxy, silicone, robber, polymer, and plastics. In some other embodiments, the resin 3 (flexible carrier 30) may be made of at least one material selected from the group consisting of: epoxy, silicone, robber, polymer, and plastics, and the resin 3 (flexible carrier 30) may further comprise additives, wherein the additives is at least one material selected from the group consisting of: metal particles, semiconductor particles, and ceramic particles. In some embodiments, the flexible carrier 30 may have a transparency sufficient to transmit at least about 10 percent in the spectrum range of (1) visible light, (2) near infrared light, or (3) visible light and near infrared light, wherein in some cases the sufficient transparency is helpful for alignment. In some embodiments, the host carrier 1 is a substrate or a plate. In some embodiments, the micro-devices 2 may be thin films, micro lenses, filters, optical masks, gratings, micro-rods, microchip dies, or light emitting diodes (LEDs). In some embodiments, the bonding layer 5 is made of at least one material selected from the group consisting of: bismuth, bismuth alloy, gallium, gallium alloy, tin, tin alloy, gold, gold alloy, indium, indium alloy, zinc, zinc alloy, cadmium, cadmium alloy, tellurium, tellurium alloy, antimony, antimony alloy, epoxy adhesive, silicon adhesive, PU adhesive, acrylic adhesive and fluorine adhesive. In some embodiments, the target member 4 may be a package, a plate, a lens, a semiconductor substrate, a glass substrate, a ceramic substrate, or a PCB board. In some embodiments, the target surface portions 7 of the outer surface 6 may be the outer surfaces of leads, circuits, bumps, optical lens, optical fiber, micro lenses, microchip dies, microchip pads, or a system-on-a-chip (SoC).

Please refer to FIGS. 2A-2E, which are the cross-sectional schematics showing the process steps of the second embodiment of a method of micro-devices transfer of the present invention. The present invention further provides the second embodiment of the method of micro-devices transfer. The method comprises following steps of: Step H~Step P. The Step H: providing a plurality of micro-devices 2, wherein each of the micro-devices 2 has a cross-section and a thickness, wherein the cross-section of each of the micro-devices 2 has a contour. The micro-devices 2 are light emitting diodes (LEDs). The Step I (please referring to FIG. 2D): providing a target member 4. The target member 4 has an outer surface 6, wherein the outer surface 6 of the target member 4 includes a plurality of target surface portions 7. The target member 4 comprises a bonding layer 5, wherein the bonding layer 5 includes a plurality of bonding layer portions formed on the target surface portions 7 of the outer surface 6 of the target member 4 respectively. The bonding layer 5 is made of gold tin solder (AuSn alloy) with Au weight percentage equal to 80 and Sn weight percentage equal to 20. The target member 4 is a substrate. The target surface portions 7 of the outer surface 6 are the outer surface of the leads, wherein the leads are formed on the target member 4. The Step J (please referring to FIG. 2A): providing a flexible carrier 30, wherein a first surface 31 of the flexible carrier 30 is facing upwards. The flexible carrier 30 comprises a plurality of grooves 8. Each of the grooves 8 has an opening in the first surface 31 of the flexible carrier 30. The opening of each of the grooves 8 has a contour. Each of the grooves 8 has a depth. The grooves 8 of the flexible carrier 30 are designed in positions corresponding one-to-one to the bonding layer portions of the bonding layer 5 formed on the target surface portions 7 of the outer surface 6 of the target member 4 (the grooves 8 of the flexible carrier 30 are also in positions corresponding one-to-one to the target surface portions 7 of the outer surface 6 of the target member 4). Moreover, the grooves 8 are designed in shapes corresponding one-to-one to the micro-devices 2, wherein the contour of the opening of each of the grooves 8 is designed the same as the contour of the cross-section of the corresponding one of the micro-devices 2, while the opening of each of the grooves 8 is designed no greater than the cross-section of the corresponding one of the micro-devices 2 and the depth of each of the grooves 8 is designed no greater than the thickness of the corresponding one of the micro-devices 2. However, the micro-devices 2 are not required to be arranged in positions corresponding one-to-one to the grooves 8 of the flexible carrier 30. The flexible carrier 30 is made of silicone. The Step K (please referring to FIG. 2B): applying at least one external force to the flexible carrier 30. The at least one external force acts horizontally outwards on a peripheral 33 of the flexible carrier 30; hence, the flexible carrier 30 is extended horizontally outwards and the opening of each of the grooves 8 is enlarged such that the opening of each of the grooves 8 becomes no smaller than the cross-section of the corresponding one of the micro-devices 2. The Step L: placing the micro-devices 2 in the corresponding grooves 8, respectively. The Step M (please referring to FIG. 2C): releasing the at least one external force such that each of the micro-devices 2 is held by the corresponding one of the grooves 8 of the flexible carrier 30. Now each of the micro-devices 2 is auto-aligned in the position of the corresponding one of the grooves 8 of the flexible carrier 30; hence, the micro-devices 2 are now in positions corresponding one-to-one to the bonding layer portions of the bonding layer 5 formed on the target surface portions 7 of the outer surface 6 of the target member 4 (the micro-devices 2 are now also in positions corresponding one-to-one to the target surface portions 7 of the outer surface 6 of the target member 4). The Step N (please referring to FIG. 2D): placing the flexible carrier 30 upside down such that the first surface 31 of the flexible carrier 30 is facing downwards. The Step O: aligning and bonding the micro-devices 2 to the corresponding bonding layer portions of the bonding layer 5 formed on the target surface portions 7 of the outer surface 6 of the target member 4, respectively. The melting temperature of the bonding layer 5 (gold tin) is about 280 degrees in C. Hence, the material of the flexible carrier 30 must have a heat-resistant temperature at least higher than the melting temperature of the bonding layer 5. When heat up to 280 degrees in C, the bonding layer 5 (gold tin) is melted. Then after cooling down, the micro-devices 2 and the corresponding target surface portions 7 of the outer surface 6 of the target member 4 are bonded by the corresponding bonding layer portions of the bonding layer 5 (gold tin). The Step P (please referring to FIG. 2E): removing the flexible carrier 30. The first embodiment of the method of micro-devices transfer can indeed achieve significantly high accuracy and auto-aligned micro-devices transfer to a flat surface (the target surface portions 7 of the outer surface 6 of the target member 4). And the cost of the equipment is significantly reduced.

Moreover, the present invention further provides an apparatus of micro-devices transfer, which comprises a flexible carrier 30, wherein the flexible carrier 30 is provided for transferring a plurality of micro-devices 2 to a target member 4. The flexible carrier 30 comprises a plurality of grooves 8, each of the grooves 8 has an opening in a first surface 31 of the flexible carrier 30. The target member 4 has an outer surface 6, the outer surface 6 of the target member 4 includes a plurality of target surface portions 7. The target member 4 comprises a bonding layer 5, wherein the bonding layer 5 includes a plurality of bonding layer portions formed on the target surface portions 7 of the outer surface 6 of the target member 4 respectively. The grooves 8 of the flexible carrier 30 are designed in positions corresponding one-to-one to the bonding layer portions of the bonding layer 5 formed on the target surface portions 7 of the outer surface 6 of the target member 4 (the grooves 8 of the flexible carrier 30 are also in positions corresponding one-to-one to the target surface portions 7 of the outer surface 6 of the target member 4). When at least one external force is applied to the flexible carrier 30, the opening of each of the grooves 8 is enlarged, the micro-devices 2 are capable of being placed in the grooves 8 respectively; after the at least one external force is released, the micro-devices 2 are held by the grooves 8 of the flexible carrier 30 and the micro-devices 2 are auto-aligned in positions corresponding one-to-one to the bonding layer portions of the bonding layer 5 formed on the target surface portions 7 of the outer surface 6 of the target member 4, so that the micro-devices 2 are capable of being aligned and bonded to the bonding layer portions of the bonding layer 5 formed on the target surface portions 7 of the outer surface 6 of the target member 4.

In some embodiments, the flexible carrier 30 may be made of at least one material selected from the group consisting of: epoxy, silicone, robber, polymer, and plastics.

In some other embodiments, the flexible carrier 30 may be made of at least one material selected from the group consisting of: epoxy, silicone, robber, polymer, and plastics, and the flexible carrier 30 may further comprise additives, wherein the additives is at least one material selected from the group consisting of: metal particles, semiconductor particles, and ceramic particles. In some embodiments, the flexible carrier 30 may have a transparency sufficient to transmit at least about 10 percent in the spectrum range of (1) visible light, (2) near infrared light, or (3) visible light and near infrared light, wherein in some cases the sufficient transparency is helpful for alignment. In some embodiments, the micro-devices 2 may be thin films, micro lenses, filters, optical masks, gratings, micro-rods, microchip dies, or light emitting diodes (LEDs). In some embodiments, the bonding layer 5 is made of at least one material selected from the group consisting of: bismuth, bismuth alloy, gallium, gallium alloy, tin, tin alloy, gold, gold alloy, indium, indium alloy, zinc, zinc alloy, cadmium, cadmium alloy, tellurium, tellurium alloy, antimony, antimony alloy, epoxy adhesive, silicon adhesive, PU adhesive, acrylic adhesive and fluorine adhesive. In some embodiments, the target member 4 may be a package, a plate, a lens, a semiconductor substrate, a glass substrate, a ceramic substrate, or a PCB board. In some embodiments, the target surface portions 7 of the outer surface 6 may be the outer surfaces of leads, circuits, bumps, optical lens, optical fiber, micro lenses, microchip dies, microchip pads, or a system-on-a-chip (SoC).

In some embodiments, each of the micro-devices 2 is protruding outwardly from the first surface 31 of the flexible carrier 30 so that the flexible carrier 30 will not be bonded by the bonding layer 5 (that is that the depth of each of the grooves 8 is designed smaller than the thickness of the corresponding one of the micro-devices 2).

Figure 2A:
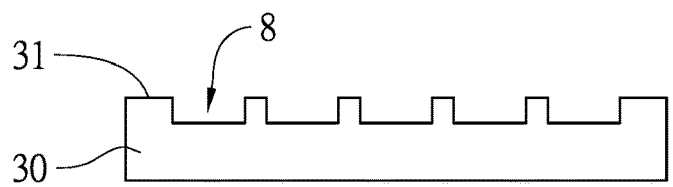
FIGS. 2A-2E are the cross-sectional schematics showing the process steps of the second embodiment of a method of micro-devices transfer of the present invention.
Figure 2B:
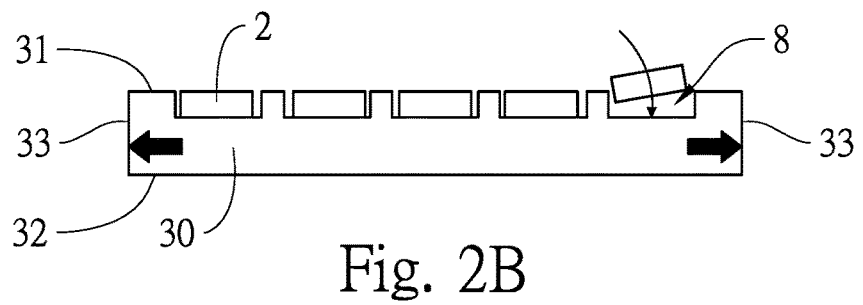
Figure 2C:
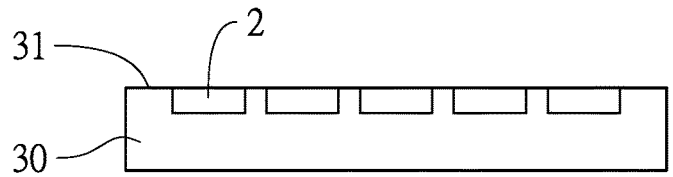
Figure 2D:
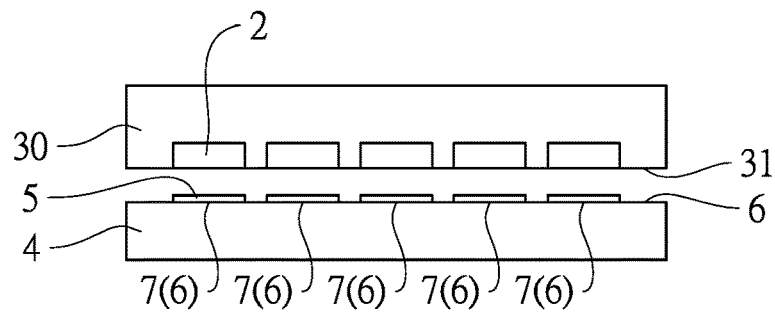
Figure 2E:
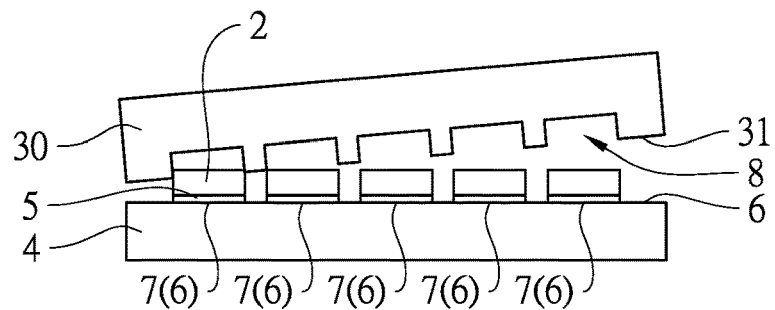
Figure 2F:
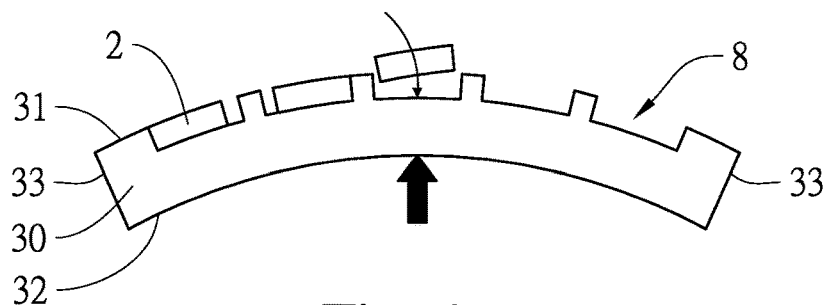
FIG. 2F is the cross-sectional schematic showing an alternative process step of the second embodiment of a method of micro-devices transfer of the present invention.

Please refer to FIG. 2F, which is the cross-sectional schematic showing an alternative process step of the second embodiment of a method of micro-devices transfer of the present invention. The Step K of the second embodiment of the method is replaced by an alternative process Step K'. The Step K': applying at least one external force to the flexible carrier 30, wherein the peripheral 33 of the flexible carrier 30 is fixed and the at least one external force acts vertically upwards on a center of a second surface 32 of the flexible carrier 30; hence, the center of the flexible carrier 30 is extended vertically upwards and the opening of each of the grooves 8 is enlarged such that the opening of each of the grooves 8 becomes no smaller than the cross-section of the corresponding one of the micro-devices 2.

In some embodiments, the at least one external force acts horizontally outwards on the peripheral 33 of the flexible carrier 30 and vertically upwards on the center of the second surface 32 of the flexible carrier 30; hence, the flexible carrier 30 is extended horizontally outwards, the center of the flexible carrier 30 is extended vertically upwards and the opening of each of the grooves 8 is enlarged such that the opening of each of the grooves 8 becomes no smaller than the cross-section of the corresponding one of the micro-devices 2.

Figure 2G:
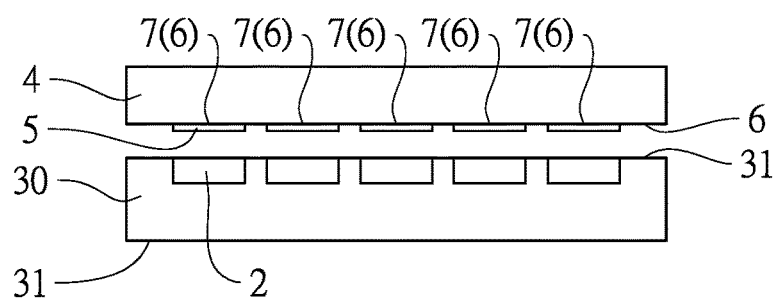
FIGS. 2G-2H are the cross-sectional schematics showing the alternative process steps of the second embodiment of a method of micro-devices transfer of the present invention.
Figure 2H:
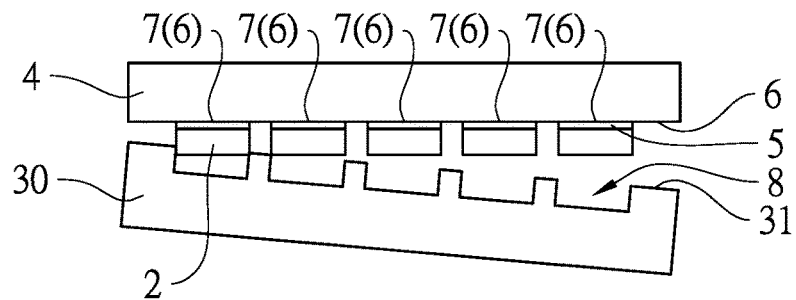
Figure 2I:
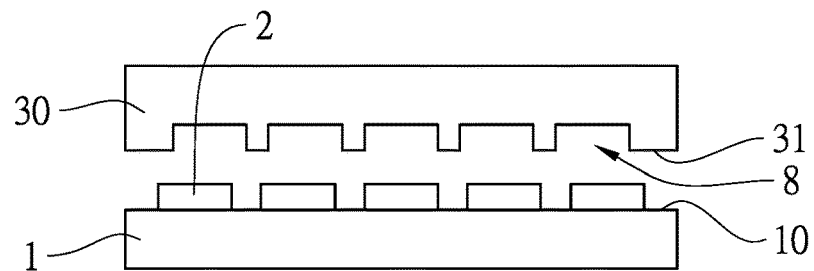
FIGS. 2I-2L are the cross-sectional schematics showing the alternative process steps of the second embodiment of a method of micro-devices transfer of the present invention.
Figure 2J:
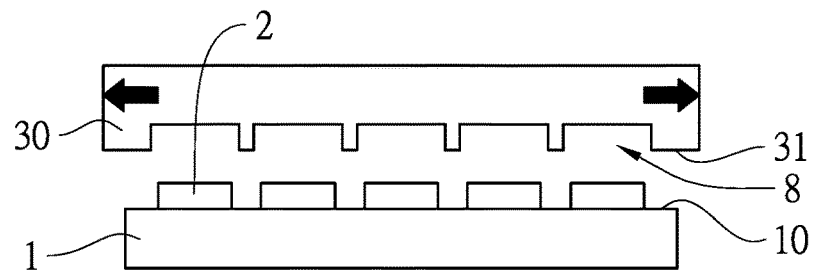
Figure 2K:
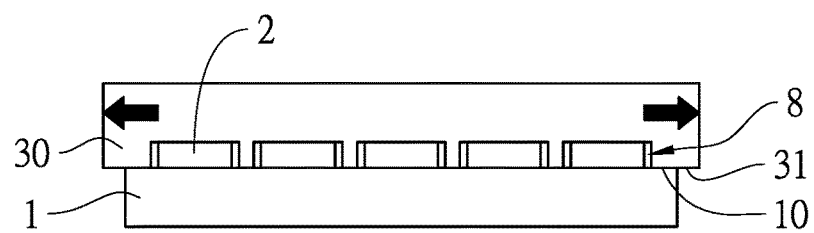
Figure 2L:
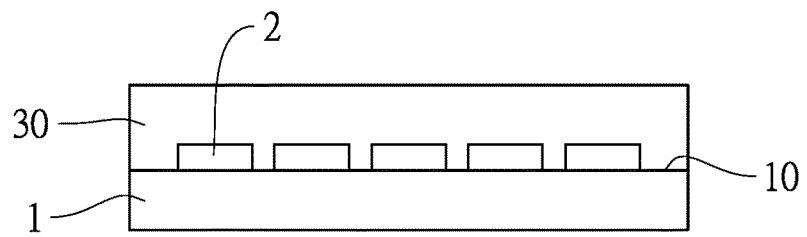

Please refer to FIGS. 2G-2H, which are the cross-sectional schematics showing the alternative process steps of the second embodiment of a method of micro-devices transfer of the present invention. In current embodiment, the method of micro-devices transfer of the present invention comprises following steps of: the Step H~the Step M, Step O' and Step P'. There is no such a Step N (placing the flexible carrier 30 upside down such that the first surface 31 of the flexible carrier 30 is facing downwards). Therefore, after the Step M (releasing the at least one external force), the first surface 31 of the flexible carrier 30 remains facing upwards. The Step O and the Step P of the second embodiment of the method are replaced by the alternative process the Step O' and the Step P'. The Step O' (please referring to FIG. 2G): aligning and bonding the micro-devices 2 to the corresponding bonding layer portions of the bonding layer 5 formed on the target surface portions 7 of the outer surface 6 of the target member 4 respectively, wherein the target member 4 in FIG. 2G is the upside down of the target member 4 in FIG. 2D. The Step P' (please referring to FIG. 2H): removing the flexible carrier 30.

Please refer to FIGS. 2I-2L, which are the cross-sectional schematics showing the alternative process steps of the second embodiment of a method of micro-devices transfer of the present invention. In current embodiment, the method of micro-devices transfer of the present invention comprises following steps of: Step H', the Step I, Step J', Step K", Step L', Step M', the Step O and the Step P. The Step H, the Step J, the Step K, the Step L and the Step M of the second embodiment of the method are replaced by the alternative process the Step H', the Step J', the Step K", the Step L' and the Step M'. The Step H' (please referring to FIG. 2I): providing a plurality of micro-devices 2, wherein the micro-devices 2 are arranged located on a top surface 10 of a host carrier 1. Each of the micro-devices 2 has a cross-section and a thickness. The cross-section of each of the micro-devices 2 has a contour. The Step I (please referring to FIG. 2D): providing a target member 4. The target member 4 has an outer surface 6, wherein the outer surface 6 of the target member 4 includes a plurality of target surface portions 7. The target member 4 comprises a bonding layer 5, wherein the bonding layer 5 includes a plurality of bonding layer portions formed on the target surface portions 7 of the outer surface 6 of the target member 4 respectively. The Step J' (please referring to FIG. 2I): providing a flexible carrier 30, wherein a first surface 31 of the flexible carrier 30 is facing downwards. The flexible carrier 30 comprises a plurality of grooves 8. Each of the grooves 8 has an opening in the first surface 31 of the flexible carrier 30. The opening of each of the grooves 8 has a contour. Each of the grooves 8 has a depth. The grooves 8 of the flexible carrier 30 are designed in positions corresponding one-to-one to the bonding layer portions of the bonding layer 5 formed on the target surface portions 7 of the outer surface 6 of the target member 4 (the grooves 8 of the flexible carrier 30 are also in positions corresponding one-to-one to the target surface portions 7 of the outer surface 6 of the target member 4). Moreover, the grooves 8 are designed in shapes corresponding one-to-one to the micro-devices 2, wherein the contour of the opening of each of the grooves 8 is designed the same as the contour of the cross-section of the corresponding one of the micro-devices 2, while the opening of each of the grooves 8 is designed no greater than the cross-section of the corresponding one of the micro-devices 2 and the depth of each of the grooves 8 is designed no greater than the thickness of the corresponding one of the micro-devices 2. However, the micro-devices 2 are arranged located on the top surface 10 of the host carrier 1, wherein the pitches of the positions of the micro-devices 2 are slightly larger than the pitches of the positions of the grooves 8 of the flexible carrier 30. The Step K" (please referring to FIG. 2J): applying at least one external force to the flexible carrier 30, wherein the at least one external force acts horizontally outwards on a peripheral 33 of the flexible carrier 30. Before applying the at least one external force, the micro-devices 2 are arranged located on the top surface 10 of the host carrier 1, the pitches of the positions of the micro-devices 2 are slightly larger than the pitches of the positions of the grooves 8 of the flexible carrier 30 and the opening of each of the grooves 8 is no greater than the cross-section of the corresponding one of the micro-devices 2; while after applying the at least one external force, the flexible carrier 30 is extended horizontally outwards and the opening of each of the grooves 8 is enlarged such that the opening of each of the grooves 8 becomes no smaller than the cross-section of the corresponding one of the micro-devices 2 and the grooves 8 of the flexible carrier 30 are now in positions corresponding one-to-one to the micro-devices 2 on the top surface 10 of the host carrier 1; that is that the micro-devices 2 are arranged located on the top surface 10 of the host carrier 1 such that the pitches of the positions of the micro-devices 2 are the same as the pitches of the positions of the grooves 8 of the flexible carrier 30 after the at least one external force is applied. The Step L' (please referring to FIG. 2K): aligning and moving the grooves 8 of the flexible carrier 30 downwards such that the micro-devices 2 are placed in the corresponding grooves 8. The Step M' (please referring to FIG. 2L): releasing the at least one external force such that each of the micro-devices 2 is held by the corresponding one of the grooves 8 of the flexible carrier 30. Now the micro-devices 2 are auto-aligned in positions corresponding one-to-one to the grooves 8 of the flexible carrier 30; hence, the micro-devices 2 are now in positions corresponding one-to-one to the bonding layer portions of the bonding layer 5 formed on the target surface portions 7 of the outer surface 6 of the target member 4 (the micro-devices 2 are now also in positions corresponding one-to-one to the target surface portions 7 of the outer surface 6 of the target member 4). The Step O (please referring to FIG. 2D): aligning and bonding the micro-devices 2 to the corresponding bonding layer portions of the bonding layer 5 formed on the target surface portions 7 of the outer surface 6 of the target member 4, respectively. The Step P (please referring to FIG. 2E): removing the flexible carrier 30.

Figure 3A:
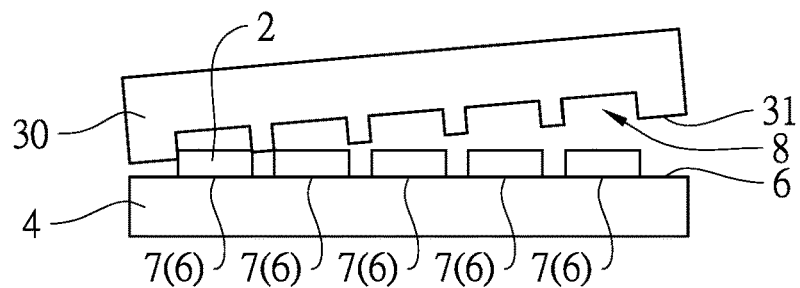
FIGS. 3A-3K are the cross-sectional schematics showing the alternative embodiments of the target member of a method of micro-devices transfer of the present invention.

Please refer to FIG. 3A, which is the cross-sectional schematic showing an alternative embodiment of the target member of a method of micro-devices transfer of the present invention. The main structure of the target member of the embodiment of FIG. 3A is basically the same as the structure of the target member of the embodiments of FIGS. 1D, 1E, 2D and 2E, except that there is no such a bonding layer 5 formed on the target surface portions 7 of the outer surface 6 of the target member 4. The micro-devices 2 are bonded to the corresponding target surface portions 7 of the outer surface 6 of the target member 4. In current embodiment, the micro-devices 2 are bonded to the corresponding target surface portions 7 of the outer surface 6 of the target member 4 by Van der Waals force. In some embodiments, the micro-devices 2 are bonded to the target surface portions 7 of the outer surface 6 of the target member 4 by chemical bond. In some other embodiments, the micro-devices 2 are bonded to the target surface portions 7 of the outer surface 6 of the target member 4 by magnetic force or electric force. In some embodiments, the micro-devices 2 are bonded to the target surface portions 7 of the outer surface 6 of the target member 4 by melting a portion of the material of the outer surface 6 of the target member 4 at a melting temperature, wherein the material of the flexible carrier 30 must have a heat-resistant temperature at least higher than the melting temperature. In some other embodiments, the micro-devices 2 are bonded to the target surface portions 7 of the outer surface 6 of the target member 4 by melting a portion of the material of the micro-devices 2 at a melting temperature, wherein the material of the flexible carrier 30 must have a heat-resistant temperature at least higher than the melting temperature. In some embodiments, the micro-devices 2 are bonded to the target surface portions 7 of the outer surface 6 of the target member 4 by melting a portion of the material of the micro-devices 2 and a portion of the material of the outer surface 6 of the target member 4 at a melting temperature, wherein the material of the flexible carrier 30 must have a heat-resistant temperature at least higher than the melting temperature.

Figure 3B:
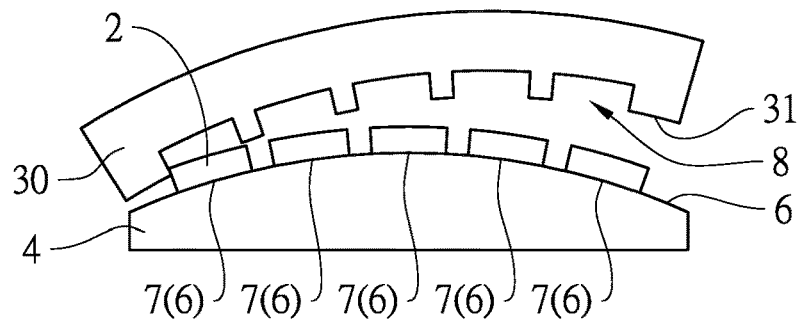

Please refer to FIG. 3B, which is the cross-sectional schematic showing another alternative embodiment of the target member of a method of micro-devices transfer of the present invention. The main structure of the target member of the embodiment of FIG. 3B is basically the same as the structure of the target member of the embodiment of FIG. 3A, except that the outer surface 6 of the target member 4 is a curved surface (a convex surface), wherein each of the target surface portions 7 of the outer surface 6 of the target member 4 is also a curved surface (a convex surface), and a curvature of the outer surface 6 of the target member 4 is the same as a curvature of each of the target surface portions 7 of the outer surface 6 of the target member 4. Hence, the first embodiment and the second embodiment of the method of micro-devices transfer of the present invention can indeed achieve to transfer the micro-devices 2 to the curved target surface portions 7 (convex) of the curved outer surface 6 (convex) of the target member 4; especially when the micro-devices 2 are flexible, the first embodiment and the second embodiment of the method of micro-devices transfer of the present invention can make the flexible micro-devices 2 to fit along the curved target surface portions 7 (convex) such that the flexible micro-devices 2 becomes curved (convex), and the curved (convex) flexible micro-devices 2 are bonded to the curved target surface portions 7 (convex) of the curved outer surface 6 (convex) of the target member 4. In some embodiments, the micro-devices 2 may be flexible optical gratings or thin films. In some embodiments, the curved outer surface 6 may be an outer surface of an optical lens.

Figure 3C:
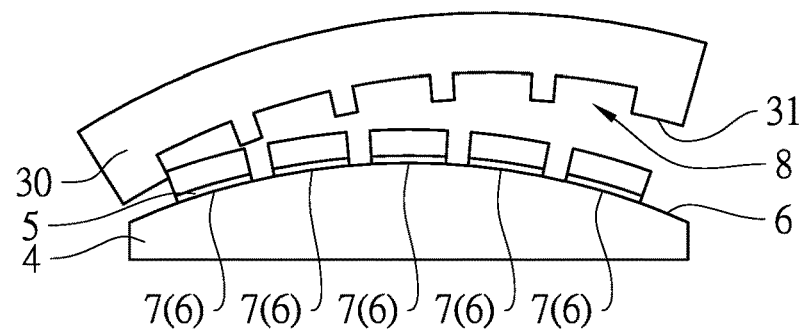

Please refer to FIG. 3C, which is the cross-sectional schematic showing another alternative embodiment of the target member of a method of micro-devices transfer of the present invention. The main structure of the target member of the embodiment of FIG. 3C is basically the same as the structure of the target member of the embodiments of FIGS. 1D, 1E, 2D and 2E, except that the outer surface 6 of the target member 4 is a curved surface (a convex surface), wherein each of the target surface portions 7 of the outer surface 6 of the target member 4 is also a curved surface (a convex surface), and a curvature of the outer surface 6 of the target member 4 is the same as a curvature of each of the target surface portions 7 of the outer surface 6 of the target member 4. The bonding layer portions of the bonding layer 5 fit along the curved target surface portions 7 (convex) and become curved. Hence, the first embodiment and the second embodiment of the method of micro-devices transfer of the present invention can indeed achieve to transfer the micro-devices 2 to the curved bonding layer portions (convex) of the bonding layer 5 formed on the curved target surface portions 7 (convex) of the curved outer surface 6 (convex) of the target member 4; especially when the micro-devices 2 are flexible, the first embodiment and the second embodiment of the method of micro-devices transfer of the present invention can make the flexible micro-devices 2 to fit along the curved bonding layer portions (convex) of the bonding layer 5 such that the flexible micro-devices 2 becomes curved (convex), and the curved (convex) flexible micro-devices 2 are bonded to the curved bonding layer portions (convex) of the bonding layer 5 formed on the curved target surface portions 7 (convex) of the curved outer surface 6 (convex) of the target member 4. In some embodiments, the micro-devices 2 may be flexible optical gratings or thin films. In some embodiments, the curved outer surface 6 may be an outer surface of an optical lens.

Figure 3D:
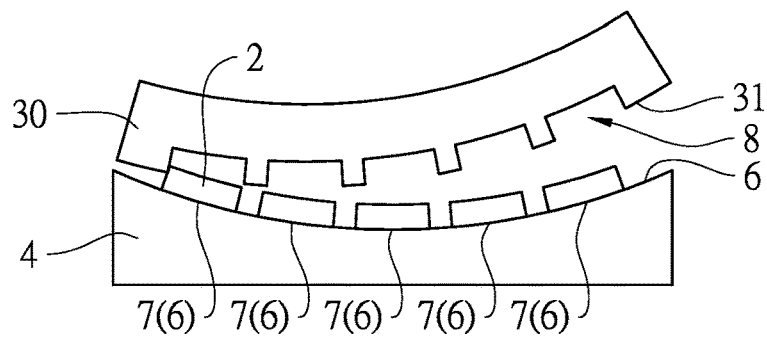

Please refer to FIG. 3D, which is the cross-sectional schematic showing another alternative embodiment of the target member of a method of micro-devices transfer of the present invention. The main structure of the target member of the embodiment of FIG. 3D is basically the same as the structure of the target member of the embodiment of FIG. 3A, except that the outer surface 6 of the target member 4 is a curved surface (a concave surface), wherein each of the target surface portions 7 of the outer surface 6 of the target member 4 is also a curved surface (a concave surface), and a curvature of the outer surface 6 of the target member 4 is the same as a curvature of each of the target surface portions 7 of the outer surface 6 of the target member 4. Hence, the first embodiment and the second embodiment of the method of micro-devices transfer of the present invention can indeed achieve to transfer the micro-devices 2 to the curved target surface portions 7 (concave) of the curved outer surface 6 (concave) of the target member 4; especially when the micro-devices 2 are flexible, the first embodiment and the second embodiment of the method of micro-devices transfer of the present invention can make the flexible micro-devices 2 to fit along the curved target surface portions 7 (concave) such that the flexible micro-devices 2 becomes curved (concave), and the curved (concave) flexible micro-devices 2 are bonded to the curved target surface portions 7 (concave) of the curved outer surface 6 (concave) of the target member 4. In some embodiments, the micro-devices 2 may be flexible optical gratings or thin films. In some embodiments, the curved outer surface 6 may be an outer surface of an optical lens.

Figure 3E:
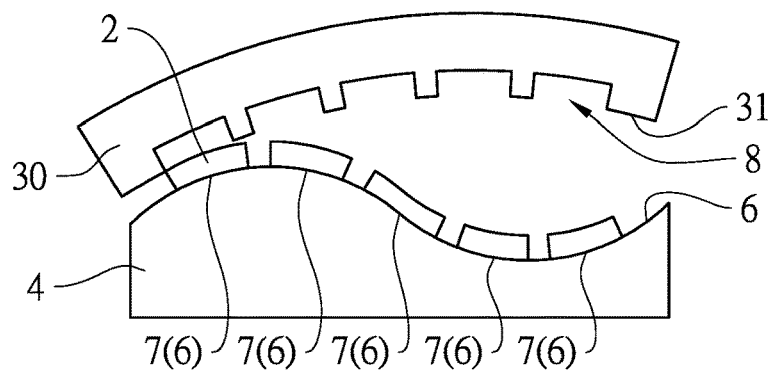

Please refer to FIG. 3E, which is the cross-sectional schematic showing another alternative embodiment of the target member of a method of micro-devices transfer of the present invention. The main structure of the target member of the embodiment of FIG. 3E is basically the same as the structure of the target member of the embodiment of FIG. 3A, except that the outer surface 6 of the target member 4 is a curved surface (a combination of a convex surface and a concave surface), wherein each of the target surface portions 7 of the outer surface 6 of the target member 4 is also a curved surface (a convex surface, a concave surface, or a combination of a convex surface and a concave surface). Hence, the first embodiment and the second embodiment of the method of micro-devices transfer of the present invention can indeed achieve to transfer the micro-devices 2 to the curved target surface portions 7 of the curved outer surface 6 of the target member 4; especially when the micro-devices 2 are flexible, the first embodiment and the second embodiment of the method of micro-devices transfer of the present invention can make the flexible micro-devices 2 to fit along the curved target surface portions 7 such that the flexible micro-devices 2 becomes curved, and the curved flexible micro-devices 2 are bonded to the curved target surface portions 7 of the curved outer surface 6 of the target member 4. In some embodiments, the micro-devices 2 may be flexible optical gratings or thin films. In some embodiments, the curved outer surface 6 may be an outer surface of an optical lens.

Figure 3F:
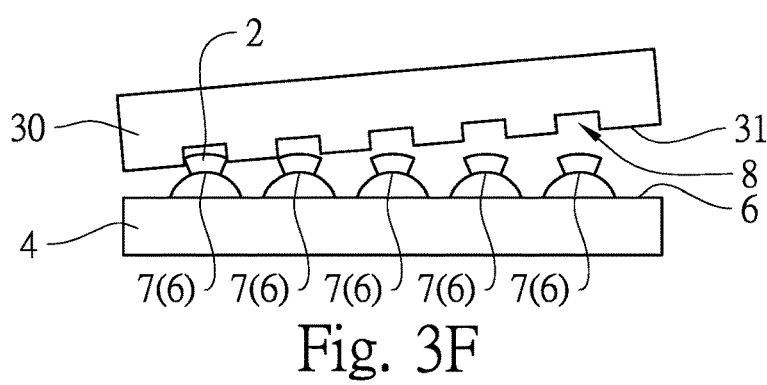

Please refer to FIG. 3F, which is the cross-sectional schematic showing another alternative embodiment of the target member of a method of micro-devices transfer of the present invention. The main structure of the target member of the embodiment of FIG. 3F is basically the same as the structure of the target member of the embodiment of FIG. 3A, except that each of the target surface portions 7 of the outer surface 6 of the target member 4 is a curved surface (a convex surface), while the rest portion of the outer surface 6 of the target member 4 (except the target surface portions 7 of the outer surface 6 of the target member 4) is a flat surface. Hence, the first embodiment and the second embodiment of the method of micro-devices transfer of the present invention can indeed achieve to transfer the micro-devices 2 to the curved target surface portions 7 (convex) of the outer surface 6 of the target member 4; especially when the micro-devices 2 are flexible, the first embodiment and the second embodiment of the method of micro-devices transfer of the present invention can make the flexible micro-devices 2 to fit along the curved target surface portions 7 (convex) such that the flexible micro-devices 2 becomes curved (convex), and the curved (convex) flexible micro-devices 2 are bonded to the curved target surface portions 7 (convex) of the outer surface 6 of the target member 4. In some embodiments, the micro-devices 2 may be flexible optical gratings or thin films. In some embodiments, the curved target surface portions 7 may be the outer surfaces of the optical lenses.

Figure 3G:
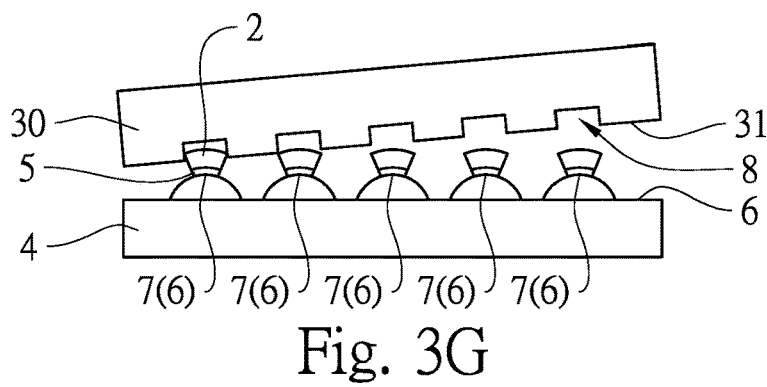

Please refer to FIG. 3G, which is the cross-sectional schematic showing another alternative embodiment of the target member of a method of micro-devices transfer of the present invention. The main structure of the target member of the embodiment of FIG. 3G is basically the same as the structure of the target member of the embodiments of FIGS. 1D, 1E, 2D and 2E, except that each of the target surface portions 7 of the outer surface 6 of the target member 4 is a curved surface (a convex surface), while the rest portion of the outer surface 6 of the target member 4 (except the target surface portions 7 of the outer surface 6 of the target member 4) is a flat surface. The bonding layer portions of the bonding layer 5 fit along the curved target surface portions 7 (convex) and become curved. Hence, the first embodiment and the second embodiment of the method of micro-devices transfer of the present invention can indeed achieve to transfer the micro-devices 2 to the curved bonding layer portions (convex) of the bonding layer 5 formed on the curved target surface portions 7 (convex) of the outer surface 6 of the target member 4; especially when the micro-devices 2 are flexible, the first embodiment and the second embodiment of the method of micro-devices transfer of the present invention can make the flexible micro-devices 2 to fit along the curved bonding layer portions (convex) of the bonding layer 5 such that the flexible micro-devices 2 becomes curved (convex), and the curved (convex) flexible micro-devices 2 are bonded to the curved bonding layer portions (convex) of the bonding layer 5 formed on the curved target surface portions 7 (convex) of the outer surface 6 of the target member 4. In some embodiments, the micro-devices 2 may be flexible optical gratings or thin films. In some embodiments, the curved target surface portions 7 may be the outer surfaces of the optical lenses.

Figure 3H:
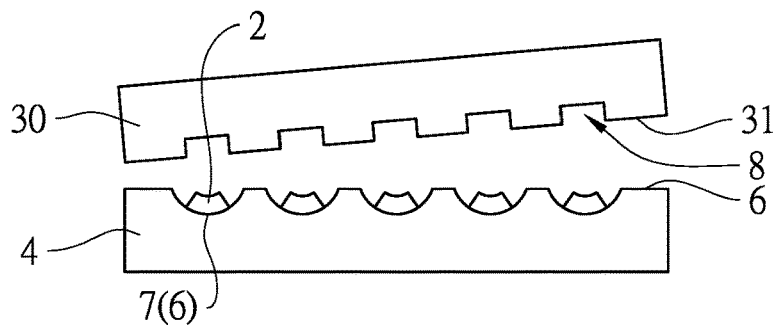

Please refer to FIG. 3H, which is the cross-sectional schematic showing another alternative embodiment of the target member of a method of micro-devices transfer of the present invention. The main structure of the target member of the embodiment of FIG. 3H is basically the same as the structure of the target member of the embodiment of FIG. 3A, except that each of the target surface portions 7 of the outer surface 6 of the target member 4 is a curved surface (a concave surface), while the rest portion of the outer surface 6 of the target member 4 (except the target surface portions 7 of the outer surface 6 of the target member 4) is a flat surface. Hence, the first embodiment and the second embodiment of the method of micro-devices transfer of the present invention can indeed achieve to transfer the micro-devices 2 to the curved target surface portions 7 (concave) of the outer surface 6 of the target member 4; especially when the micro-devices 2 are flexible, the first embodiment and the second embodiment of the method of micro-devices transfer of the present invention can make the flexible micro-devices 2 to fit along the curved target surface portions 7 (concave) such that the flexible micro-devices 2 becomes curved (concave), and the curved (concave) flexible micro-devices 2 are bonded to the curved target surface portions 7 (concave) of the outer surface 6 of the target member 4. In some embodiments, the micro-devices 2 may be flexible optical gratings or thin films. In some embodiments, the curved target surface portions 7 may be the outer surfaces of the optical lenses.

Figure 3I:
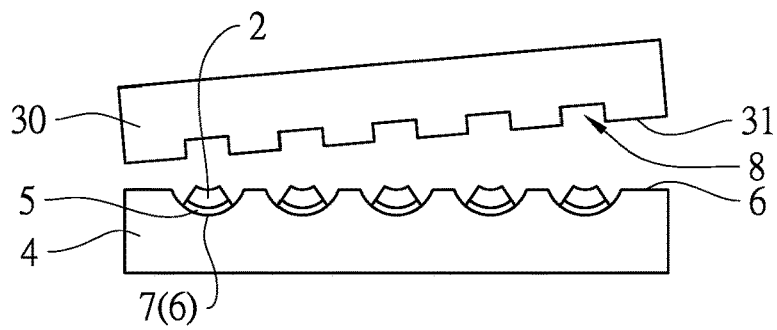

Please refer to FIG. 3I, which is the cross-sectional schematic showing another alternative embodiment of the target member of a method of micro-devices transfer of the present invention. The main structure of the target member of the embodiment of FIG. 3I is basically the same as the structure of the target member of the embodiments of FIGS. 1D, 1E, 2D and 2E, except that each of the target surface portions 7 of the outer surface 6 of the target member 4 is a curved surface (a concave surface), while the rest portion of the outer surface 6 of the target member 4 (except the target surface portions 7 of the outer surface 6 of the target member 4) is a flat surface. The bonding layer portions of the bonding layer 5 fit along the curved target surface portions 7 (concave) and become curved. Hence, the first embodiment and the second embodiment of the method of micro-devices transfer of the present invention can indeed achieve to transfer the micro-devices 2 to the curved bonding layer portions (concave) of the bonding layer 5 formed on the curved target surface portions 7 (concave) of the outer surface 6 of the target member 4; especially when the micro-devices 2 are flexible, the first embodiment and the second embodiment of the method of micro-devices transfer of the present invention can make the flexible micro-devices 2 to fit along the curved bonding layer portions (concave) of the bonding layer 5 such that the flexible micro-devices 2 becomes curved (concave), and the curved (concave) flexible micro-devices 2 are bonded to the curved bonding layer portions (concave) of the bonding layer 5 formed on the curved target surface portions 7 (concave) of the outer surface 6 of the target member 4. In some embodiments, the micro-devices 2 may be flexible optical gratings or thin films. In some embodiments, the curved target surface portions 7 may be the outer surfaces of the optical lenses.

Figure 3J:
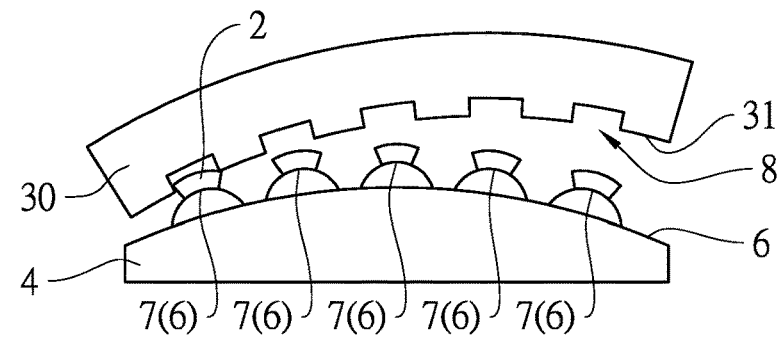

Please refer to FIG. 3J, which is the cross-sectional schematic showing another alternative embodiment of the target member of a method of micro-devices transfer of the present invention. The main structure of the target member of the embodiment of FIG. 3J is basically the same as the structure of the target member of the embodiment of FIG. 3F, except that the rest portion of the outer surface 6 of the target member 4 (except the target surface portions 7 of the outer surface 6 of the target member 4) is a curved surface (a convex surface), wherein a curvature of the rest portion of the outer surface 6 of the target member 4 is different from a curvature of each of the target surface portions 7 of the outer surface 6 of the target member 4, wherein the curvature of the rest portion of the outer surface 6 of the target member 4 is smaller than the curvature of each of the target surface portions 7 of the outer surface 6 of the target member 4. In some embodiments, the micro-devices 2 may be flexible optical gratings or thin films. In some embodiments, the curved outer surface 6 may be an outer surface of an optical lens and the curved target surface portions 7 may be the outer surfaces of other optical lenses.

Figure 3K:
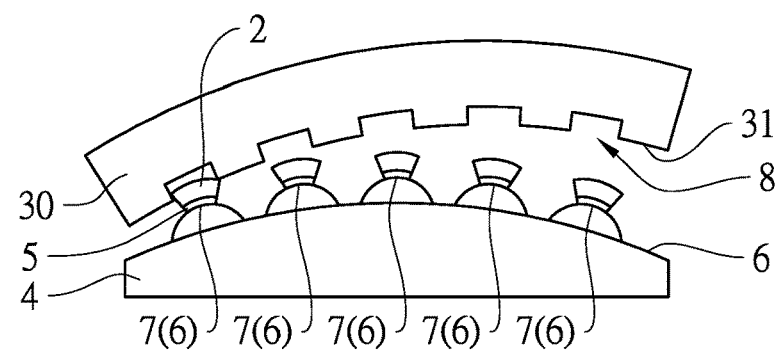
Figure 4A:
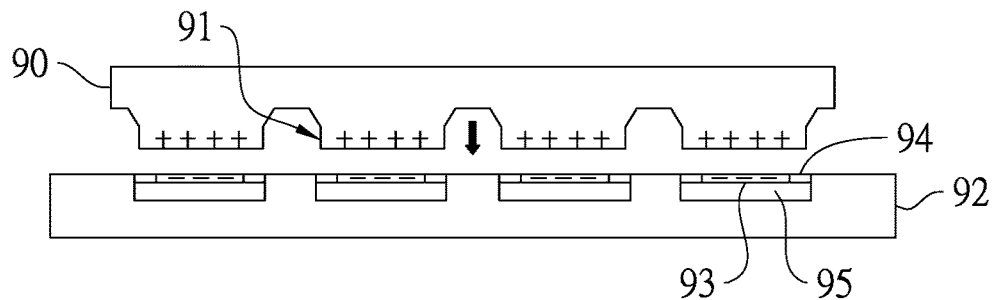
FIGS. 4A-4D are the cross-sectional schematics showing the process steps of a method of micro-devices transfer of convention technology.
Figure 4B:
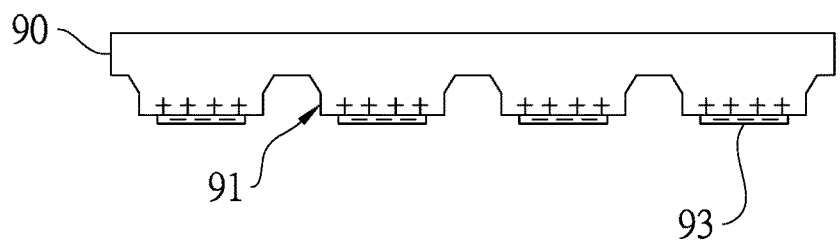
Figure 4C:
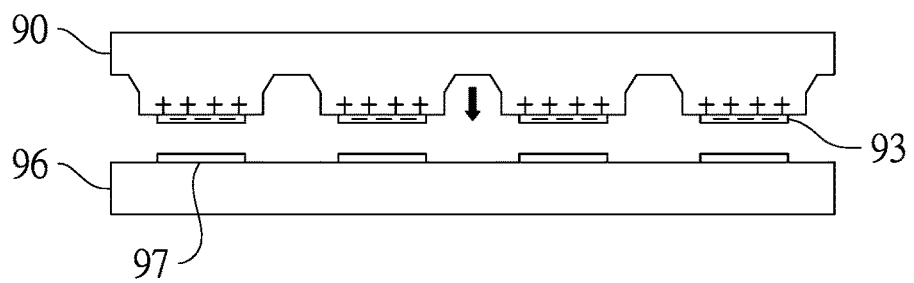
Figure 4D:
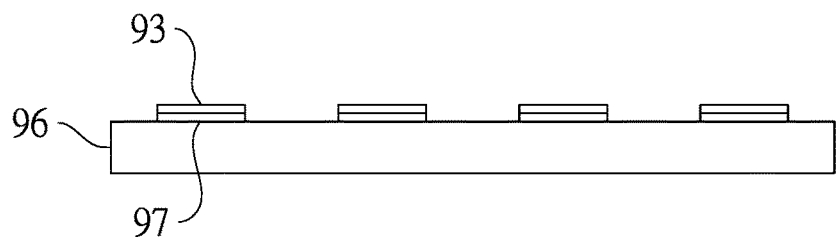

Please refer to FIG. 3K, which is the cross-sectional schematic showing another alternative embodiment of the target member of a method of micro-devices transfer of the present invention. The main structure of the target member of the embodiment of FIG. 3K is basically the same as the structure of the target member of the embodiment of FIG. 3G, except that the rest portion of the outer surface 6 of the target member 4 (except the target surface portions 7 of the outer surface 6 of the target member 4) is a curved surface (a convex surface), wherein a curvature of the rest portion of the outer surface 6 of the target member 4 is different from a curvature of each of the target surface portions 7 of the outer surface 6 of the target member 4, wherein the curvature of the rest portion of the outer surface 6 of the target member 4 is smaller than the curvature of each of the target surface portions 7 of the outer surface 6 of the target member 4. In some embodiments, the micro-devices 2 may be flexible optical gratings or thin films. In some embodiments, the curved outer surface 6 may be an outer surface of an optical lens and the curved target surface portions 7 may be the outer surfaces of other optical lenses.

In some embodiments, the transparency of the flexible carrier 30 is sufficient to transmit at least about 15 percent in the spectrum range of (1) visible light, (2) near infrared light, or (3) visible light and near infrared light. In some other embodiments, the transparency of the flexible carrier 30 is sufficient to transmit at least about 20 percent in the spectrum range of (1) visible light, (2) near infrared light, or (3) visible light and near infrared light. In some embodiments, the transparency of the flexible carrier 30 is sufficient to transmit at least about 25 percent in the spectrum range of (1) visible light, (2) near infrared light, or (3) visible light and near infrared light. In some other embodiments, the transparency of the flexible carrier 30 is sufficient to transmit at least about 30 percent in the spectrum range of (1) visible light, (2) near infrared light, or (3) visible light and near infrared light. In some embodiments, the transparency of the flexible carrier 30 is sufficient to transmit at least about 35 percent in the spectrum range of (1) visible light, (2) near infrared light, or (3) visible light and near infrared light. In some other embodiments, the transparency of the flexible carrier 30 is sufficient to transmit at least about 40 percent in the spectrum range of (1) visible light, (2) near infrared light, or (3) visible light and near infrared light. In some embodiments, the transparency of the flexible carrier 30 is sufficient to transmit at least about 50 percent in the spectrum range of (1) visible light, (2) near infrared light, or (3) visible light and near infrared light. In some other embodiments, the transparency of the flexible carrier 30 is sufficient to transmit at least about 60 percent in the spectrum range of (1) visible light, (2) near infrared light, or (3) visible light and near infrared light. In some embodiments, the transparency of the flexible carrier 30 is sufficient to transmit at least about 70 percent in the spectrum range of (1) visible light, (2) near infrared light, or (3) visible light and near infrared light.

As disclosed in the above description and attached drawings, the present invention can provide an apparatus and a method of micro-devices transfer. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A method of micro-devices transfer comprising following steps of:
   providing a target member, wherein said target member has an outer surface, said outer surface of said target member includes a plurality of target surface portions;
   providing a plurality of micro-devices, wherein said micro-devices are arranged located on a host carrier in positions corresponding one-to-one to said target surface portions of said outer surface of said target member;
   coating a resin on an outer surface of each of said micro-devices and an exposed top surface of said host carrier, wherein said resin is fully covered on and is in full contact with said outer surface of each of said micro-devices;
   curing said resin to form a flexible carrier;
   removing said host carrier;
   aligning and bonding said micro-devices to said target surface portions of said outer surface of said target member; and
   removing said flexible carrier.

2. The method according to claim 1, wherein said outer surface of said target member is a curved surface.

3. The method according to claim 1, wherein each of said target surface portions of said outer surface of said target member is a curved surface.

4. The method according to claim 3, wherein said outer surface of said target member is a curved surface.

5. The method according to claim 1, wherein said flexible carrier is made of at least one material selected from the group consisting of: epoxy, silicone, robber, polymer, and plastics.

6. The method according to claim 1, wherein said flexible carrier further comprises additives, said additives is at least one material selected from the group consisting of: metal particles, semiconductor particles, and ceramic particles.

7. A method of micro-devices transfer comprising following steps of:
   providing a plurality of micro-devices;
   providing a target member, wherein said target member has an outer surface, said outer surface of said target member includes a plurality of target surface portions;
   providing a flexible carrier, wherein said flexible carrier comprises a plurality of grooves, said grooves of said flexible carrier are designed in positions corresponding one-to-one to said target surface portions of said outer surface of said target member, wherein each of said grooves has an opening in a first surface of said flexible carrier;
   applying at least one external force to said flexible carrier such that said opening of each of said grooves is enlarged;
   placing said micro-devices in said grooves respectively;
   releasing said at least one external force such that said micro-devices are held by said grooves of said flexible carrier and said micro-devices are auto-aligned in positions corresponding one-to-one to said target surface portions of said outer surface of said target member;
aligning and bonding said micro-devices to said target surface portions of said outer surface of said target member; and
removing said flexible carrier.

8. The method according to claim 7, wherein after releasing said at least one external force and before aligning and bonding said micro-devices to said target surface portions of said outer surface of said target member, said method further comprises a following step of:
placing said flexible carrier upside down.

9. The method according to claim 7, wherein before applying at least one external force to said flexible carrier, said micro-devices are provided and arranged located on a host carrier; wherein when applying at least one external force to said flexible carrier, said opening of each of said grooves is enlarged and said grooves of said flexible carrier are in positions corresponding one-to-one to said micro-devices arranged located on said host carrier; wherein after releasing said at least one external force, said micro-devices are held by said grooves of said flexible carrier and said micro-devices are auto-aligned in positions corresponding one-to-one to said target surface portions of said outer surface of said target member.

10. The method according to claim 7, wherein said opening of each of said grooves is designed no larger than a cross-section of a corresponding one of said micro-devices.

11. The method according to claim 7, wherein a contour of said opening of each of said grooves is designed the same as a contour of a cross-section of a corresponding one of said micro-devices.

12. The method according to claim 7, wherein said outer surface of said target member is a curved surface.

13. The method according to claim 7, wherein each of said target surface portions of said outer surface of said target member is a curved surface.

14. The method according to claim 13, wherein said outer surface of said target member is a curved surface.

15. The method according to claim 7, wherein said flexible carrier is made of at least one material selected from the group consisting of: epoxy, silicone, robber, polymer, and plastics.

16. The method according to claim 7, wherein said flexible carrier further comprises additives, said additives is at least one material selected from the group consisting of: metal particles, semiconductor particles, and ceramic particles.

17. The method according to claim 7, wherein a depth of each of said grooves is designed no greater than a thickness of a corresponding one of said micro-devices.

18. An apparatus of micro-devices transfer comprising:
a flexible carrier, wherein said flexible carrier is provided for transferring a plurality of micro-devices to a target member, wherein said flexible carrier comprises a plurality of grooves, each of said grooves has an opening in a first surface of said flexible carrier, said target member has an outer surface, said outer surface of said target member includes a plurality of target surface portions, said grooves of said flexible carrier are designed in positions corresponding one-to-one to said target surface portions of said outer surface of said target member; when at least one external force is applied to said flexible carrier, said opening of each of said grooves is enlarged, said micro-devices are capable of being placed in said grooves respectively; after said at least one external force is released, said micro-devices are held by said grooves of said flexible carrier and said micro-devices are auto-aligned in positions corresponding one-to-one to said target surface portions of said outer surface of said target member, so that said micro-devices are capable of being aligned and bonded to said target surface portions of said outer surface of said target member.

19. The apparatus according to claim 18, wherein said opening of each of said grooves is designed no larger than a cross-section of a corresponding one of said micro-devices.

20. The apparatus according to claim 18, wherein a contour of said opening of each of said grooves is designed the same as a contour of a cross-section of a corresponding one of said micro-devices.

21. The apparatus according to claim 18, wherein said outer surface of said target member is a curved surface.

22. The apparatus according to claim 18, wherein each of said target surface portions of said outer surface of said target member is a curved surface.

23. The apparatus according to claim 22, wherein said outer surface of said target member is a curved surface.

24. The apparatus according to claim 18, wherein said flexible carrier having a transparency sufficient to transmit at least about 10 percent in the spectrum range of (1) visible light, (2) near infrared light, or (3) visible light and near infrared light.

25. The apparatus according to claim 18, wherein said flexible carrier is made of at least one material selected from the group consisting of: epoxy, silicone, robber, polymer, and plastics.

26. The apparatus according to claim 18, wherein said flexible carrier further comprises additives, said additives is at least one material selected from the group consisting of: metal particles, semiconductor particles, and ceramic particles.

27. The apparatus according to claim 18, wherein a depth of each of said grooves is designed no greater than a thickness of a corresponding one of said micro-devices.

* * * * *